United States Patent [19]

Wangler

[11] Patent Number: 5,343,489
[45] Date of Patent: Aug. 30, 1994

[54] ARRANGEMENT FOR SHAPING A LASER BEAM AND FOR REDUCING THE COHERENCE THEREOF

[75] Inventor: Johannes Wangler, Königsbronn, Fed. Rep. of Germany

[73] Assignee: Carl-Zeiss-Stiftung, Heidenheim, Fed. Rep. of Germany

[21] Appl. No.: 912,277

[22] Filed: Jul. 13, 1992

[30] Foreign Application Priority Data

Jul. 23, 1991 [DE] Fed. Rep. of Germany ....... 4124311

[51] Int. Cl.⁵ .............................................. H01S 3/08
[52] U.S. Cl. ..................................... 372/93; 392/700; 392/108
[58] Field of Search .................... 372/24, 92, 99, 108, 372/700, 93

[56] References Cited

U.S. PATENT DOCUMENTS

| | | | |
|---|---|---|---|
| 3,488,693 | 3/1970 | Fein et al. | 372/24 |
| 3,575,668 | 4/1971 | Smith | 372/93 |
| 4,001,705 | 1/1977 | Sinclair et al. | 372/24 |
| 4,686,542 | 8/1987 | Yip et al. | |
| 4,744,615 | 5/1988 | Fan et al. | |
| 4,872,179 | 10/1989 | Nitsche et al. | 372/93 |
| 4,930,138 | 5/1990 | Opower et al. | 372/99 |
| 4,938,738 | 7/1990 | Opower | 372/95 |
| 5,005,969 | 4/1991 | Kataoka | |

FOREIGN PATENT DOCUMENTS

1497580 4/1969 Fed. Rep. of Germany .

*Primary Examiner*—Leon Scott, Jr.
*Attorney, Agent, or Firm*—Walter Ottesen

[57] ABSTRACT

The invention is directed to an arrangement for shaping a laser beam and for reducing the coherence thereof. The arrangement has at least two approximately parallel mirrors arranged approximately perpendicular to the laser beam. One of the mirrors is fully reflective whereas the other mirror is partially reflective so that the exiting light beam comprises several mutually adjacent or partially overlapping component beams which are reflected a different number of times. The spacing of the mirrors is greater than half the coherence length of the laser. An advantageous embodiment provides the arrangement on a plane-parallel glass plate with the degree of reflection of the partially-reflective mirror being reduced in a stepwise manner and with a partial overlapping of the exiting component beams.

10 Claims, 3 Drawing Sheets

ARRANGEMENT FOR SHAPING A LASER BEAM AND FOR REDUCING THE COHERENCE THEREOF

BACKGROUND OF THE INVENTION

In U.S. Pat. No. 4,744,615, an arrangement for reducing coherence is disclosed in an embodiment having a light tunnel. The light must be fed into the light tunnel divergently and leaves the tunnel with intense divergence.

A paper by J. Wangler et al entitled "Design principles for an illumination system using an excimer laser as a light source", Proceeding ELO II, Volume 1138, page 129, Paris 1989, discloses various alternatives including a moved diffusion screen, lenticular array and non-imaging concentrator which are similar to embodiments disclosed in the above-mentioned United States Patent. Furthermore, this paper discloses the use and the requirements for UV-lithography.

In U.S. Pat. No. 4,686,542, the use of a plane-parallel plate having one side which is fully reflecting and another which is partially reflecting is described for splitting a laser beam into several separate parallel beams for a raster output scanner. The partially reflecting surface of the plane-parallel plate is partially reflecting in such a manner that a stepwise reduction in the degree of reflection is provided.

SUMMARY OF THE INVENTION

It is an object of the invention to provide an arrangement for shaping a laser beam and for reducing the coherence thereof with the arrangement having few fixed optical elements which does not significantly change the low divergence of the laser beam. The arrangement is suitable for use in an illuminating device for lithography in the low ultraviolet range and for reducing speckle effects. The beam cross section can be changed by the arrangement and be formed as required.

According to a feature of the invention, two mirrors are mounted approximately perpendicularly to the laser beam with the mirrors being at least approximately parallel. One mirror is partially reflecting and the other mirror is as fully reflecting as possible. The exiting light beam comprises a plurality of mutually adjacent or partially overlapping component beams which are reflected in the arrangement a different number of times. The spacing of the mirrors is greater than half the coherence length of the laser and the path difference of two component beams is each greater than the entire coherence length. The coherence length is computed from the spectral distribution.

The laser beam is pivoted somewhat toward the perpendicular to the mirror plane and, in this way, the condition is obtained that the multiply reflected beams are offset laterally by the partially-reflecting mirror.

The laser beam can advantageously enter next to the fully-reflecting mirror as well as through the partially-reflecting mirror.

For homogenizing the exiting light beam, it is advantageous when the partially-reflecting mirror is mirrored differently over its width with the degree of reflection varying in a stepwise manner or continuously.

The mirrors can be mounted on two carriers separated by air, a gas or vacuum with one of the carriers being transparent or, the mirrors can be mounted on both sides of a plane-parallel transparent plate especially a plate made of glass.

The geometry can be so configured that the exiting component beams just join so as to lie laterally next to each other. The exiting light beam can be made more homogeneous when one laser beam having an intensity which reduces toward its edge is overlapped by the next component beam.

A further advantageous possibility of homogenizing the exiting light beam is provided when the degree of reflection of the partially-reflecting mirror is so varied that this mirror at least partially compensates the non-homogeneity of the laser intensity in each exiting component beam.

The rectangular beam cross section conventional for commercially available excimer lasers can easily be made approximately quadratic which is advantageous for arranging the lens optics.

For obtaining a reliable coherence reduction with effective beam expansion and with realistic mirror characteristics, it is advantageous if the nun%her of reflections at the fully-reflective mirror of the arrangement of the invention amounts to between 5 and 20.

The typical coherence length is 20 mm for a KrF excimer laser suitable for lithography in the high ultraviolet range. Accordingly, a mirror arrangement is provided wherein the mirrors are at a spacing which is greater than half the coherence length of the laser.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
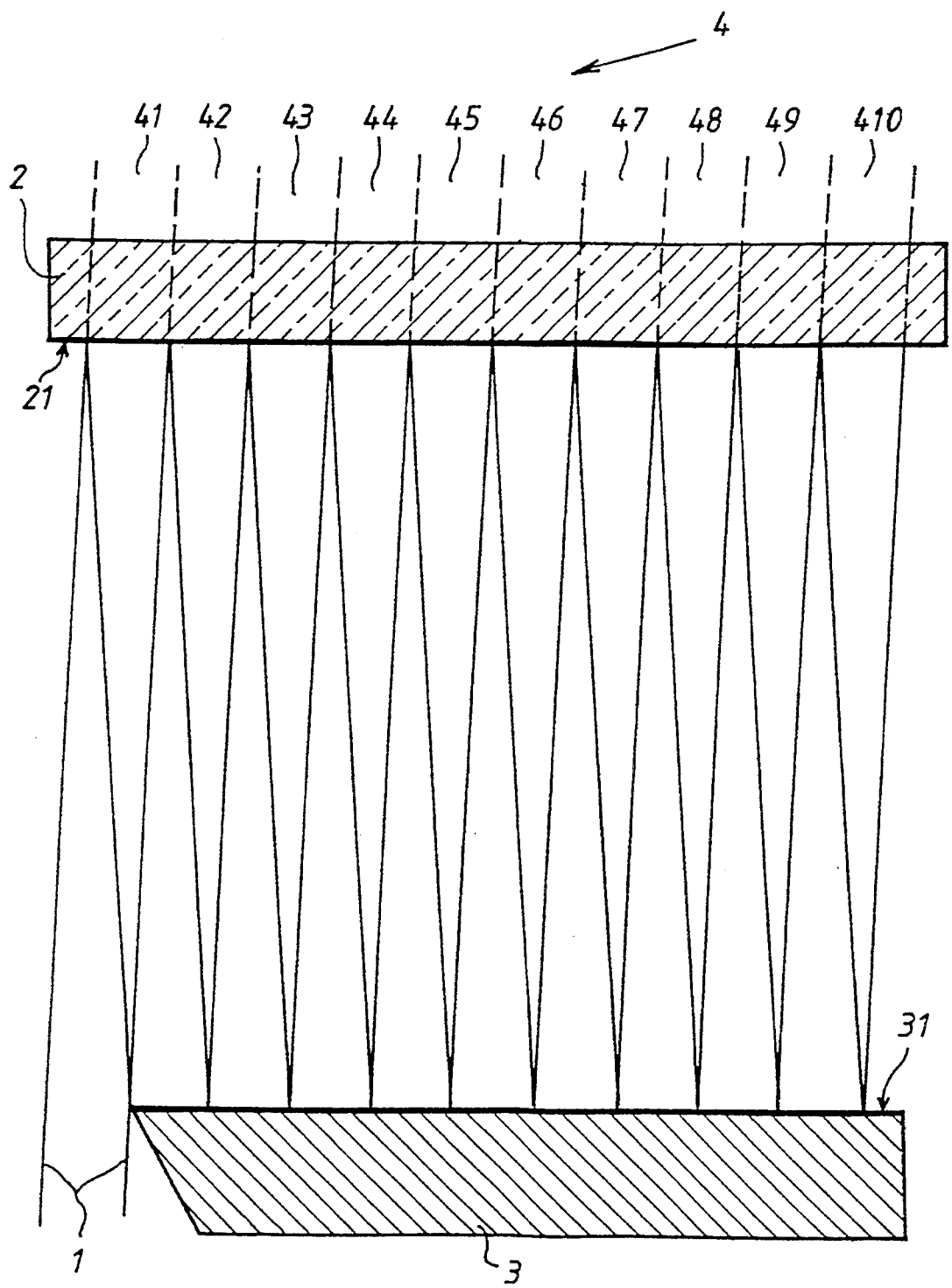
FIG. 1 is a schematic of a laser beam reflected between two plane-parallel mirrors with one mirror being fully reflective and the other being partially reflective.

FIG. 1 shows a laser beam 1, for example, a KrF excimer laser beam, having a wavelength of 248 nm, a coherence length of 20 mm and a width of 2 mm with an elevation of 20 mm.

The laser beam 1 impinges at an angle of barely 4° to the perpendicular onto a plane-parallel mirror 2 comprising a transparent carrier and a partially-reflective layer 21.

A second plane-parallel mirror 3 is disposed opposite and parallel to the plane-parallel mirror 2 and directly next to the laser beam 1. The second plane-parallel mirror 3 has a fully-reflective layer 31 disposed on a carrier. The spacing of the mirrors 2 and 3 is just 20 mm and is therefore almost as large as the coherence length of the laser beam 1.

A light bundle 4 passes out of the partially-reflective mirror 2 and comprises ten component beams 41 to 410 which exit one directly next to the other. The light beam 4 then has a quadratic cross section of 20×20 mm². The traversal path difference between each two component bundles (41, 42 etc.) amounts to approximately 40 mm and is twice as large as the coherence length of the laser beam 1. The component beams (41, 42 etc.) are therefore completely decoupled with respect to coherence.

Figure 2:
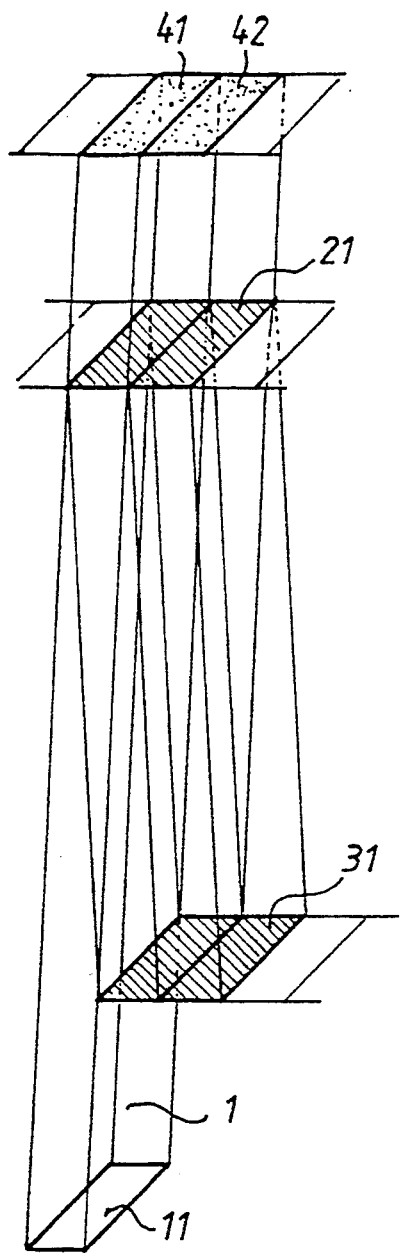
FIG. 2 is a perspective view of the embodiment shown in FIG. 1.

A portion of the embodiment of FIG. 1 is shown perspectively in FIG. 2. The component beams (41, 42) touch side by side without a gap therebetween.

Figure 3:
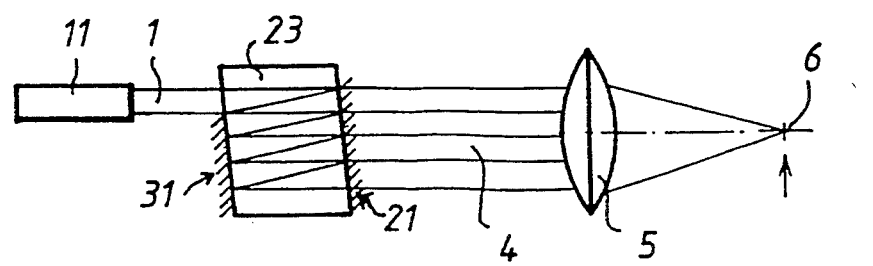
FIG. 3 is an embodiment having a transparent carrier reflective on both sides with the carrier being mounted in a laser illuminating arrangement.

FIG. 3 shows the arrangement for coherence reduction included in a laser illuminating device. The laser 11 emits a laser beam 1 of limited cross section which is fed into a configuration having a partially-reflective mirror 21 and a fully-reflective mirror 31. The configuration differs from the air-filled embodiment of FIG. 1 only by the use of a single transparent carrier 23 having reflective layers (21, 31) on respective sides thereof.

The exiting light beam 4 has, for the same divergence of the light beam 1, a much greater cross section (tenfold) and is reduced in coherency. The focusing by a lens 5 therefore results in a focus spot 6 in which speckle effects are reduced by the coherence reduction and the spot size is reduced or the energy density is increased by the larger cross section of the focusing beam 4.

In order to effectively achieve the foregoing, the light intensity must however be as homogeneous as possible across the cross section of the exiting beam 4.

Figure 4:
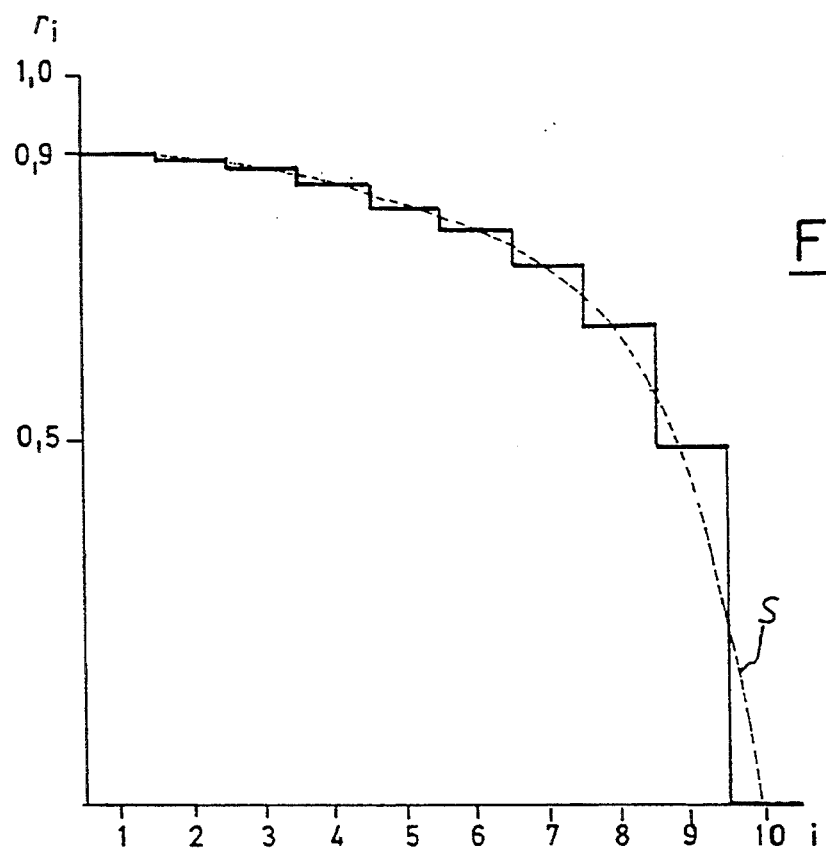
FIG. 4 is a diagram showing the reflection coefficient as a function of the width of the partially-reflecting mirror for two embodiments; and, FIG. 5 is a schematic wherein the component beams are arranged to overlap and where a laser beam has an intensity which falls off toward the edge.

An intensity change occurs with each reflection and partial transmission at the partially-reflective mirror 21. This intensity change of the beam arriving at the partially-reflective mirror 21 must be compensated. For this purpose, the degree of reflection is reduced in a stepwise manner. FIG. 4 shows this in an embodiment having an ideal degree of reflection (R=100%) of the fully-reflective mirror 31 and with ten exiting component beams 41 to 410 as shown in FIG. 1.

For ten component beams (41 to 410) (i=1 to 10) 10% of the laser beam intensity $I_o$ is to be applied to each component so that the degree of reflection $r_i$ is selected so as to be constant for each component beam over the width of the component beam i and decreases progressively from 0.9 in the region of the component beam 41 (i=1) to 0.5 for component beam 49 (i=9) and to 0 for component beam 410 (i=10). For:

n = number of component beams (41 to 410)
$I_o$ = intensity of the entering beam
reflectance of the fully-reflective mirror (31) (R≈1.00)
$r_i$ = reflectance of the partially-reflective mirror (21) at the location of the i(th) component beam
$I_i^t$ = transmitted intensity of the i(th) component beam
$I_i^R$ = reflected intensity of the i(th) component beam
Then:

$$r_i = \frac{1}{R} \left( 1 - \frac{I_i^t}{I_{i-1}^R} \right) \quad i = 1 \ldots n \qquad \text{Eq. 1}$$

Eq. 2 with $I_i^R = r_i \cdot I_{i-1}^R \cdot R$

It is especially important for $$I_i^t = \text{constant} = \frac{I_o}{n}$$

$$r_i = \frac{1}{R} \left( 1 - \frac{I_o}{n \cdot I_{i-1}^R} \right) \qquad \text{Eq. 1a)}$$

Example where $I_o=1$; R=100% and n=10:

| i | $r_i$ | $I_i^R$ | $I_i^t$ |
|---|-------|---------|---------|
| 1 | 0.900 | 0.900 | 0.1 |
| 2 | 0.889 | 0.800 | 0.1 |
| 3 | 0.875 | 0.700 | 0.1 |
| 4 | 0.857 | 0.600 | 0.1 |
| 5 | 0.833 | 0.500 | 0.1 |
| 6 | 0.800 | 0.400 | 0.1 |
| 7 | 0.750 | 0.300 | 0.1 |
| 8 | 0.667 | 0.200 | 0.1 |
| 9 | 0.500 | 0.100 | 0.1 |
| 10 | 0.000 | 0.000 | 0.1 |
| Total = | | | 1.0 |

In lieu of a stepwise reduction of the degree of reflection, a continuous compensating curve S can be applied in approximation if the production cost and adjusting effort is to be reduced (the cost and effort are caused by the steps in the degree of reflection). The degree of reflection can however have especially adapted curves for compensating for non-homogeneities of the intensity of the laser beam.

Figure 5:
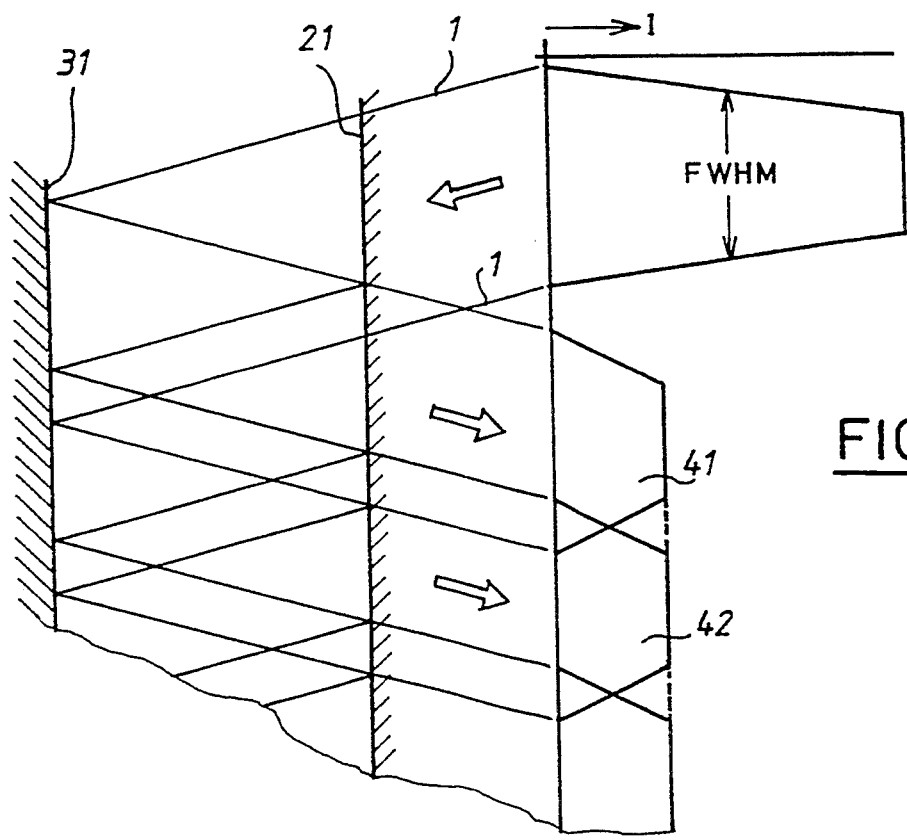

A simple compensation of the typical intensity drop to the edge of the laser beam 1 (Gauss profile) is obtained as shown in FIG. 5 with a partial overlapping of the exiting component beams (41, 42 etc). This is possible by means of suitable selection of the spacing of the mirrors (21, 31) and the angles of incidence of the laser beam 1. The spacing of the same edges of mutually adjacent component beams (41, 42 etc.) varies advantageously between the full beam width of the laser beam 1 (as in FIG. 1) and the full half-value width FWHM of the laser beam 1. In this case, it is advantageous, as shown in FIG. 5, to permit the laser beam to enter through the partially-reflective mirror 21 because for an embodiment according to FIG. 1 (entry next to the fully-reflective mirror 31) otherwise shading would occur at the edge of the mirror.

The number of the component beams (41 to 410) generated with the arrangement and which form the exiting light beam 4 is advantageously set to approximately to 5 to 20. Magnitude and spacing of the mirrors (21, 31), the entry angle of the laser beam 1 and the trace of the degree of reflection of the partially-reflective mirror 21 are accordingly matched. In the upward direction, this number is limited by the unavoidable reflection and scattering losses (such as at the fully-reflective mirror 31) and the usable cross section of the exiting light beam 4. With fewer reflections, the effect of coherence reduction is still too small since then each component beam (41 etc) inherently still has the coherence characteristics of the laser beam 1. Likewise, the homogenization of the intensity profile is still low.

The arrangement according to the invention can be used singly, multiply and in combination with known measures for reducing coherence and homogenization such as disclosed in the above-mentioned paper of Wangler et al.

A combination of two arrangements according to the invention rotated relative to each other by 90° and having an anamorphotic lens interposed therebetween is suitable for reducing coherence in two orthogonal directions.

It is understood that the foregoing description is that of the preferred embodiments of the invention and that various changes and modifications may be made thereto without departing from the spirit and scope of the invention as defined in the appended claims.

What is claimed is:

1. An arrangement for shaping a laser beam having a predetermined coherence length and for reducing the coherence thereof, the laser beam having a first cross section and the arrangement comprising:

a transparent carrier block having two mutually opposite planar surfaces approximately parallel to each other and at an angle to the laser beam and said planar surfaces being disposed at a distance from each other which is greater than half of said coherence length;

first and second mirrors being applied to corresponding ones of said planar surfaces to reflect said laser beam therebetween;

said first mirror being fully reflective and said second mirror being partially reflective and partially transmissive so as to multiply reflect said laser beam between said first and second mirrors and to transmit a component beam through said second mirror with each reflection with no gap between mutually adjacent component beams transmitted through said second mirror and which are reflected a different number of times in said arrangement accompanied by a corresponding intensity change for each reflection;

said component beams conjointly defining a composite beam of reduced coherence exiting from said second mirror and having a second cross section greater than said first cross section; and, said second mirror being reflectively coated in varying amounts over the width thereof to compensate for said intensity change with each reflection thereby making said composite beam more homogeneous across said second cross section.

2. The arrangement of claim 1, wherein said laser beam enters said block next to said first mirror.

3. The arrangement of claim 1, wherein said laser beam enters said block through said second mirror.

4. The arrangement of claim 1, wherein said second mirror is reflectively coated to have a reflection factor which becomes less in a stepwise manner.

5. The arrangement of claim 1, wherein said second mirror is reflectively coated to have a reflection factor which varies continuously.

6. The arrangement of claim 5, wherein said varying reflection factor at least partially compensates the non-homogeneity of the laser beam over the beam cross section.

7. The arrangement of claim 1, wherein said laser beam has a predetermined width and said component beams exit from between said first and second mirrors; and, said angle and said spacing being so selected for said predetermined width that the exiting component beams are directly joined one next to the other.

8. The arrangement of claim 1, wherein said component beams exit from between said first and second mirrors and the exiting component beams being partially overlapping, 9. The arrangement of claim 1, wherein said laser beam enters said block between said first and second mirrors and said composite beam exits from between said first and second mirrors; and, the exiting composite beams having an approximately quadratic cross section.

10. The arrangement of claim 1, wherein the number of reflections at said first mirror lies between 5 and 20.

* * * * *

UNITED STATES PATENT AND TRADEMARK OFFICE
CERTIFICATE OF CORRECTION

PATENT NO. : 5,343,489

DATED : August 30, 1994

INVENTOR(S) : Johannes Wangler

It is certified that error appears in the above-identified patent and that said Letters Patent is hereby corrected as shown below:

Item [56],
On the title page, under "References Cited, U. S. PATENT DOCUMENTS": please delete
"3,488,693 3/1970 Fein et al ...... 372/24" and substitute
-- 3,498,693 3/1970 Fein et al ...... 372/24 -- therefor.

In column 2, line 21: delete "nun%her" and substitute -- number -- therefor.

In column 3, line 49: before "reflectance", insert -- R = --.

In column 5, line 3: delete "it" and substitute -- It -- therefor.

Signed and Sealed this

First Day of November, 1994

Attest:

BRUCE LEHMAN

Attesting Officer      Commissioner of Patents and Trademarks